United States Patent [19]

Wendling

[11] 4,309,529

[45] Jan. 5, 1982

[54] WATER-DISPERSIBLE ENERGY CURABLE HETEROCYCLIC GROUP-CONTAINING POLYESTERS

[75] Inventor: Larry A. Wendling, Maplewood, Minn.

[73] Assignee: Minnesota Mining and Manufacturing Company, St. Paul, Minn.

[21] Appl. No.: 148,776

[22] Filed: May 12, 1980

[51] Int. Cl.³ .................... C08G 63/68; C08G 69/44
[52] U.S. Cl. ................... 528/289; 204/159.19; 525/438; 526/263; 528/296; 528/297
[58] Field of Search ............ 528/289, 296, 297; 525/438; 204/159.19; 526/263

[56] References Cited

U.S. PATENT DOCUMENTS

| | | | |
|---|---|---|---|
| 3,649,597 | 3/1972 | Henley | 260/67.5 |
| 3,804,735 | 4/1974 | Radlone et al. | 204/159.23 |
| 3,808,226 | 4/1974 | Habermeler et al. | 260/309.5 |
| 3,856,744 | 12/1974 | Radlone et al. | 260/40 R |
| 3,893,979 | 7/1975 | Wolf et al. | 260/77.5 AO |
| 3,920,732 | 11/1975 | Radlone | 260/486 B |
| 3,925,310 | 12/1975 | Wolf et al. | 260/47 CZ |
| 3,928,289 | 12/1975 | Reilly et al. | 260/75 NQ |
| 3,928,298 | 12/1975 | Wolf et al. | 260/88.7 B |
| 4,053,441 | 10/1977 | Wagener et al. | 260/18 N |
| 4,108,803 | 8/1978 | Green et al. | 96/76 R |
| 4,127,565 | 11/1978 | King et al. | 260/75 N |
| 4,163,097 | 7/1979 | Baumann et al. | 525/531 |
| 4,180,612 | 12/1979 | Pauzë et al. | 528/289 |
| 4,224,206 | 9/1980 | Sollner | 260/29.2 N |

FOREIGN PATENT DOCUMENTS 1400978 7/1975 United Kingdom .
1400979 7/1975 United Kingdom .

*Primary Examiner*—Lucille M. Phynes
*Attorney, Agent, or Firm*—Cruzan Alexander; Donald M. Sell; Lorraine R. Sherman

[57] ABSTRACT

Water-dispersible radiation curable polyesters having backbone hydantoin groups and alpha-methylene groups are disclosed. These polyesters are useful in the field of graphic arts.

27 Claims, No Drawings

WATER-DISPERSIBLE ENERGY CURABLE HETEROCYCLIC GROUP-CONTAINING POLYESTERS

TECHNICAL FIELD

This invention relates to water-dispersible radiation curable polyesters containing hydantoin moieties and also containing backbone alpha-methylene groups.

BACKGROUND ART

In the field of graphic arts it is extremely useful that polymers having utility as, for example, printing plates be form-stable, adherent, abrasion resistant and water dispersible so that when these polymers are imaged the unexposed areas may be water or water/alcohol developable. In addition, it is desirable that these polymers photo-cure by crosslinking to a nontacky state in the presence of air. Such crosslinking often involves free-radical polymerization.

Historically, radical crosslinking of polymers has been effected by incorporating a high proportion (typically 50% by weight) of a polyethylenically unsaturated crosslinking agent in the polymer formation. Upon application of light or heat to generate free radicals, the polymer becomes immobilized by entrapment in the crosslinked network derived from a crosslinking agent or via chemical bonding. An alternative approach involves direct attachment to the polymer of photosensitive functionality, usually ethylenic unsaturation. This approach utilizes only one component and alleviates many problems associated with two-component systems, such as incompatibility, phase separation, etc. A disadvantage to this approach is that polymers of molecular weight in excess of 50,000 generally fail to effectively cure to tightly crosslinked networks. Consequently, desirable properties such as solvent resistance and abrasion resistance cannot be obtained. The presumed reason for the inefficient curing of polymers with molecular weight greater than 50,000 is that the higher molecular weight polymers have insufficient mobility (especially after several crosslinks have formed) for significant crosslinking interactions to occur.

Lower molecular weight polymers, i.e. those of molecular weight equal to or less than 5,000 readily cure to give high crosslink densities and subsequently good solvent resistance and abrasion resistance. However, these polymers lack inherent toughness and flexibility and consequently are brittle and lack tear resistance.

The incorporation of heterocyclic units into polymers including polyaldehydes, polyesters, polyamides, polyurethanes and polyethers in order to introduce hydrophilic properties into the polymers is described in the patent art. Examples of such art include U.S. Pat. Nos. 3,649,597 (polyaldehydes), 3,928,298 (polyethers), 3,893,979 (polyetherurethanes), 3,925,310 (polyamides), 3,928,289, 4,053,441 and 4,127,565. None of this art, however, teaches water-dispersible radiation-curable hydantoin unit-containing polyesters.

Water-soluble photocurable polyacrylates containing hydantoin as a heterocyclic unit are described in U.S. Pat. No. 3,808,226. These polyacrylates are prepared by condensation of unsymmetrical diglycidyl hydantoins with dicarboxylic acids to produce oligomers having a molecular weight of less than about 1400 that are then endcapped with acrylate functionality. Such heterocyclic unit-containing polyacrylates have only two acrylic groups per molecule. Also, their polymerization by exposure to radiation is relatively slow.

U.S. Pat. Nos. 3,920,732 (G.B. Pat. No. 1,400,978 is an equivalent), 3,804,735 and its division 3,856,744 (G.B. Pat. No. 1,400,979 is an equivalent), disclose photocurable compositions comprising mixtures of a beta-hydroxy ester and a polyitaconate. The beta-hydroxy ester is prepared by the reaction of an aliphatic aromatic or heterocyclic polyepoxide and ethylenically-unsaturated monocarboxylic acid. The polyitaconate is prepared by the reaction of about 0.8 to about 1 mole itaconic acid with about 1 to about 1.2 mole polyepoxide (preparation described in U.S. Pat. No. 3,847,770). These patents are directed to the production of solvent-free fluid polyester compositions that are not water-soluble and can be cured to a hard polymer. There is no disclosure of form-stable water-dispersible polyesters that can be cured by radiation.

U.S. Pat. No. 4,108,803 discloses water-soluble photopolymerizable epoxy resins containing pendant unsaturated ester or amidomethyl groups. Included among the epoxy resins disclosed in this patent are resins prepared by the reaction in a first stage of a heterocyclic diepoxide and dicarboxylic acids followed by reaction in a second stage of the product of the first stage with an unsaturated compound (for example, acrylic acid). This second stage reaction produces a polyester having a plurality of ethylenically unsaturated groups but does not produce polyesters having a plurality of backbone alpha-methylene groups.

The heterocyclic group-containing polyesters of this invention display the hydrophilic properties of hydantoin polymers described in the prior art. However, the polymers of this invention further incorporate photoactive functionality into the backbone of the polymer as opposed to pendant functionality described in the existing art. The procedure for incorporating photoactive backbone sites into the polymer offers an easier synthetic approach and provides greater crosslink density without sacrificing hydrophilicity than is attainable via the "pendant" approach. The high crosslink density available from the "backbone" approach provides cured films with enhanced resistance to abrasion and solvents. In addition to necessitating a second synthetic step to impart photoactivity to the polymer, the "pendant" approach generally reduces hydrohilicity by replacing a water-solubilizing functionality with an hydrophobic photoactive group.

The heterocyclic group-containing polymers of this invention are different from the polyepoxideitaconates described in the prior art. The prior art specifies the use of aromatic or aliphatic epoxides for the preparation of polyitaconates; consequently, these materials display no water solubility. This invention teaches the use of water-soluble heterocyclic epoxides which impart hydrophilic character to the polyitaconates. This property provides the ability to image these polymers and develop unexposed areas with water or water/alcohol developers. Furthermore, the polymers of this invention are form-stable, have enhanced adhesion to a variety of substrates and photocure readily to a nontacky state in the presence of air.

One aspect of the present invention relates to water-dispersible polyesters which photocure to a nontacky state in the presence of air. The backbone structures of these novel polyesters contain hydantoin units and alpha-methylene groups.

More particularly, the present invention relates to a family of water-dispersible, form-stable polymers of intermediate molecular weight, (i.e., 3,000–30,000) which cure rapidly in the presence of air to highly crosslinked networks that are solvent resistant, tough, and abrasion resistant.

Another aspect of the present invention relates to a method of preparing these novel polyesters.

A further aspect of this invention relates to radiation-sensitive, aqueous or aqueous/alcohol developable imageable elements containing the compositions disclosed herein.

An additional aspect of the present invention relates to the solvent resistant energy crosslinked compositions produced when the novel polyesters disclosed herein are cured.

DISCLOSURE OF INVENTION

In accordance with the invention, water-dispersible form-stable polyesters having a number average molecular weight of about 3,000 to about 30,000 and a backbone containing alpha-methylene groups and heterocyclic moieties, and a process for preparing such polyesters are provided. Also provided are energy crosslinked compositions comprising the polyesters and water or water/alcohol developable radiation-sensitive elements comprising the compositions. The polyesters of the invention have repeating units of the general formula:

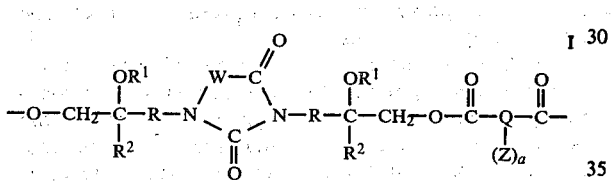

wherein
R is a single bond or an alkylene group having 1 to 6 carbon atoms and optionally one catenary oxygen;
$R^1$ is hydrogen but can be

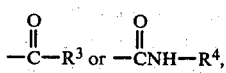

wherein $R^3$ is preferably alkenyl but can be alkyl having 2 to 5 carbon atoms and can be substituted by phenyl or carboxyl and $R^4$ is aliphatic or aromatic hydrocarbyl having up to 8 carbon atoms and is preferably acryloyloxyalkyl or a methacryloyloxyalkyl group, in which the alkyl group has 2 to 4 carbon atoms;
$R^2$ is hydrogen or methyl;
W is a divalent group that is required to complete a 5- or 6-membered heterocyclic ring, preferably, W is

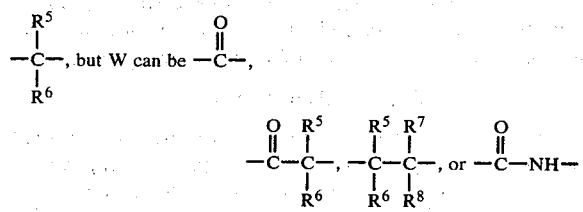

wherein $R_5$, $R_6$, $R_7$ and $R_8$ are independently hydrogen or lower alkyl of 1 to 4 carbon atoms;
Q is the divalent or trivalent residue of hydrocarbyl di- or tri-carboxylic acids, said residue formed by the removal of active hydrogens from the carboxylic acid groups and containing up to 40 carbon atoms, preferably containing 4 to 12 carbon atoms, and optionally containing catenary oxygen atoms, of which carboxylic acids at least 10 mole percent have alpha-methylene groups;
a is zero or one, but can be one for no more than 20 mole percent of the carboxylic acids; and

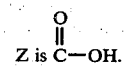

The polyesters of the invention allow the preparation of radiation-sensitive water or water/alcohol developable elements such as printing plates that do not require the use of binders that reduce curing speeds and cause development problems (e.g., cause formation of scum, etc.).

DETAILED DESCRIPTION OF THE INVENTION

The compounds of this invention generally can be prepared by the base catalyzed, preferably the tertiary amine catalyzed, reaction of one mole equivalent of a bis-(epoxy)heterocyclic compound and from about 0.8 to 1.2 mole equivalents of polycarboxylic acid (one or more dicarboxylic acids can be used) in accordance with the equation:

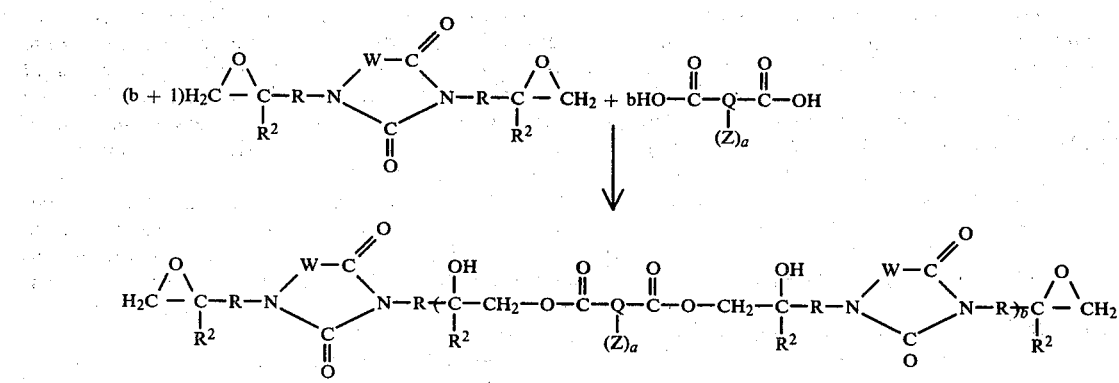

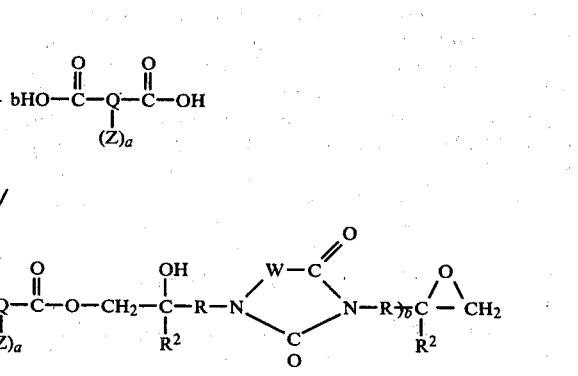

wherein R, $R^2$, Q, a, Z, and W are as defined before and b is a number having a value between about 5 and 60 sufficient to provide the polyester with a number average molecular weight between about 3,000 and about 30,000.

The catalyzed reaction, wherein a catalytically active amount of a base polymerization catalyst is utilized, can be performed in the presence or absence of solvent. Generally, the epoxide, polycarboxylic acid, catalyst, inhibitor for thermal polymerization, and solvent, if used, are heated from 50° to 120° C., preferably about 80° to 100° C., until the disappearance of the epoxy group as may be shown by chemical titration analysis, is observed. Heating for from 2 to 40 hours usually suffices to complete the reaction.

The hydroxyl groups present in compounds of formula I (i.e., where $R^1$ is hydrogen) can be acylated by treatment with an acylating agent, preferably by an acyl halide, an acyl anhydride, or an isocyanate that may contain polymerizable ethylenically unsaturated groups.

By adjustment of the ratio of bis-(epoxy)-heterocyclic compound to dicarboxylic acid, the terminal groups in the polyester can be controlled as is known in the addition polymer art. Thus, an excess (about 1 to 10%) of the bis-epoxide over the dicarboxylic acid gives polyesters having terminal epoxy groups and an excess (about 1 to 10%) of the dicarboxylic acid over the bis-epoxide gives polyesters having terminal carboxylic groups. Essentially equivalent amounts of bis-epoxide and dicarboxylic acid give polyesters having, on average, both carboxyl and epoxy terminal groups. When the terminal groups of the polyester are epoxy, these terminal groups are readily converted to acryloyl, methacryloyl or mixtures thereof by reaction with acrylic or methacrylic acid as is known in the art.

Suitable bis-epoxyheterocyclic compounds for use in the practice of the present invention have the formula:

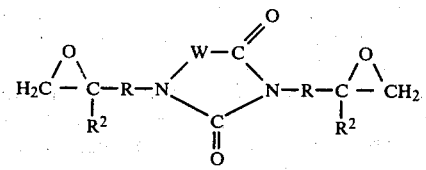

wherein R, $R^2$ and W are as defined for formula I.

Examples of suitable bis-(epoxy)heterocyclic compounds include:
1,3-diglycidylhydantoin
1,3-diglycidyl-5-amylhydantoin
1,3-diglycidyl-5-octylhydantoin
1,3-diglycidyl-5-methylhydantoin
1,3-diglycidyl-5,5-dimethylhydantoin
1,3-diglycidyl-5-ethyl-5-methylhydantoin
1,3-diglycidyl-5-ethyl-5-hexylhydantoin
1,3-di(2-glycidyloxyethyl)-5,5-dimethylhydantoin
1,3-di(3-glycidyloxypropyl)-5,5-dimethylhydantoin
1,3-diepoxyethyl-5,5-dimethylhydantoin
1,3-diglycidyluracil
1,3-diglycidyl-6-methyluracil
1,3-diglycidyl-5,5-dimethyl-5,6-dihydrouracil
1,3-di(β-methylglycidyl)-5,5-dimethyl-5,6-dihydrouracil
1,3-diglycidylisocyanurate
1,3-diepoxyethylisocyanurate Other suitable bis-(epoxy)heterocyclic compounds are listed in U.S. Pat. Nos. 3,808,226 and 4,137,139 which are incorporated into this application by reference.

The preferred bis-(epoxy)heterocyclic compounds are the 1,3-diglycidylhydantoins such as 1,3-diglycidyl-5,5-dimethylhydantoin, 1,3-diglycidyl-5-ethyl-5-methylhydantoin, 1,3diglycidyl-5hexyl-5-methyldantion, and 1,3-di(3-glycidyloxypropyl)-5,5-dimethylhydantoin.

Suitable polycarboxylic acids for use in the practice of this invention have the formula:

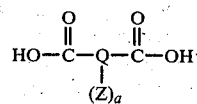

where Q and a and Z are defined for formula I. The polycarboxylic acids may be saturated or unsaturated, aliphatic, cycloaliphatic, aromatic, or heterocyclic and may be substituted optionally by non-interfering groups such as alkyls, unsaturated alkyls, heterocyclics, sulfonates, esters, ethers, halohydrocarbons, amides and carbamates. Examples of suitable dicarboxylic acids include: oxalic, succinic, glutaric, adipic, suberic, sebacic, undecanedicarboxylic, hexadecanedicarboxylic, 1,2,3-propanetricarboxylic, tricarballylic, dimerized fatty acids (such as obtained by the polymerization of olefinically unsaturated monocarboxylic acids containing 16 to 20 carbon atoms such as oleic acid, linoleic acid and the like. The dimer acid of linoleic acid is described in U.S. Pat. No. 3,753,463). Other useful dicarboxylic acids are diglycolic, dilactic, 3,3'-(ethylenedioxy)dipropionic, phthalic, isophthalic, terephthalic, 5-sulfonatoisophthalic, trimellitic, trimesic, diphenic, phenylenediacetic, benzylsuccinic, 1,4-naphthalenedicarboxylic, 5-chloro-1,3-benzenedicarboxylic, tetrachlorophthalic, 1,2-cyclohexanedicarboxylic, 2,4-pyridinedicarboxylic, 2,5-tetrahydrofuranedicarboxylic, maleic, but-2-enedioic, 1,5-pent-2-enedioic, itaconic, α-methyleneglutaric, α-methyleneadipic, α-methylitaconic, and α,α-dimethylitaconic.

The polyesters of the invention having 100 mole percent down to about 50 mole percent of alpha-methylene dicarboxylic acid and 0 to about 50 mole percent of dicarboxylic acid not having an alpha-methylene group are highly responsive to polymerization by actinic radiation even in the presence of oxygen. With a decrease of dicarboxylic acids having alpha-methylene content below about 50 mole percent, the rate of polymerization of the polyester decreases, so that below about 10–20 mole percent alpha-methylene-containing dicarboxylic acids, curing on exposure to actinic radiation proceeds very slowly.

The polyesters of the invention contain secondary hydroxyl groups which are formed on reaction of heterocyclic diepoxide with polycarboxylic acid as is shown in Equation II. These hydroxyls can be functionalized by reaction with an acylation group and thereby the polyester can be tailored to desirable properties such as increased solubility in a particular solvent, improved tensile strength and reduced flammability. In this manner, $R^1$ of formula I is replaced by

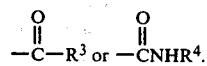

Exemplary acylation agents from which $R^1$ is derived include acid chlorides such as acetyl chloride, propionyl chloride, valeryl chloride, dodecanoyl chloride, acryloyl chloride, methacryloyl chloride, alpha-chloroacryloyl chloride, crotonoyl chloride, benzoyl chloride, phenylacetyl chloride, cinnamoyl chloride and 2,4-dichlorophenylacetyl chloride; the corresponding carboxylic acids and anhydrides; other anhydrides include the anhydrides of dicarboxylic acids such as maleic anhydride, succinic anhydride, methylenesuccinic anhydride, phthalic anhydride, and 3-chlorophthalic anhydride; and organic isocyanates such as methyl isocyanate, ethyl isocyanate, n-butyl isocyanate, phenyl isocyanate, 4-t-butyl isocyanate, acryloyloxyethyl isocyanate, methacryloyloxyethyl isocyanate, 4-methacryloyloxybutyl isocyanate, 4-acryloylphenyl isocyanate and 4-vinylphenyl isocyanate. Preferred acylating agents are the acryloyloxyalkyl isocyanates in which the alkyl group has 2 to 4 carbon atoms such as methacryloyloxyethyl isocyanate. Other preferred acylating agents are maleic anhydride and succinic anhydride. The acryloyloxyalkyl isocyanates are preferred for acylation because of the relative ease of reaction with the secondary hydroxyls of the polyester and because they provide an efficient procedure for increasing the ethylenic unsaturation of the polyester. The anhydrides of dicarboxylic acids are preferred acylating agents. When these agents are used to acylate the secondary hydroxyls of the polyester, carboxyl groups are introduced, thereby increasing the solubility of the polyester in aqueous solvents.

By reaction of the secondary hydroxyls of the polyester with ethylenically unsaturated acylation agents, the ethylenic unsaturation of polyesters having a low content of backbone alpha-methylene groups can be increased. This increase, of course, increases the rate of curing of the polyester on exposure to a given amount of energy.

Where the polyesters have been prepared using an excess of diepoxyheterocyclic compound, they contain terminal epoxy groups. These groups can be reacted with nucleophiles to open the epoxide ring and provide terminal ester groups. Where these nucleophiles are ethylenically substituted such as acrylic acid and methacrylic acid, the polyester becomes terminated with these groups.

The radiation polymerizable compositions of the invention comprise the polyesters having backbone alpha-methylene groups and sufficient polymerization initiators for bringing about polymerization on subjection of the composition to actinic radiation.

Polymerization initiators suitable for use in the crosslinkable compositions of the invention are those compounds which liberate or generate a free-radical on addition of energy. Such catalysts include peroxy, azo, and redox systems all of which are well known and are described frequently in polymerization art. Included among free-radical catalysts are the conventional heat activated catalysts such as organic peroxides and organic hydroperoxides; examples are benzoyl peroxide, tertiary-butyl perbenzoate, cumene hydroperoxide, azobis(isobutyronitrile) and the like. The preferred catalysts are photopolymerization initiators which facilitate polymerization when the composition is irradiated. Included among such initiators are acyloin and derivatives thereof, such as benzoin, benzoin methyl ether, benzoin ethyl ether, benzoin isopropyl ether, benzoin isobutyl ether, and α-methylbenzoin, diketones such as benzil and diacetyl, etc.; organic sulfides such as diphenyl monosulfide, diphenyl disulfide, decyl phenyl sulfide, and tetramethylthiuram monosulfide; S-acyl dithiocarbamates, such as S-benzoyl-N,N-dimethyldithiocarbamate; phenones such as acetophenone, α,α,α-tribromoacetophenone, α,α-diethoxyacetophenone, 2,2-dimethoxy-2-phenylacetophenone, o-nitro-α,α,α-tribromoacetophenone; benzophenone, and p,p'-tetramethyldiaminobenzophenone; sulfonyl halides such as p-toluene sulfonyl chloride, 1-naphthalenesulfonyl chloride, 2-naphthalenesulfonyl chloride, 1,3-benzenedisulfonyl chloride, 2,4-dinitrobenzenesulfonyl bromide and p-acetamidobenzenesulfonyl chloride. Normally, the initiator is used in amounts ranging from about 0.01 to 5% by weight of the total polymerization composition. When the quantity is less than 0.01% by weight, the polymerization rate becomes extremely low. If the initiator is used in excess of 5% by weight, no correspondingly improved effect can be expected. Thus, addition of such greater quantity is economically unjustified. Preferably, about 0.25 to 1.0% of initiator is used in the polymerizable composition.

The polyesters of the invention can, but do not have to be, formulated with ethylenically unsaturated monomers. Ethylenically unsaturated monomers suitable for formulation with the polyesters include methyl methacrylate, ethyl acrylate, 2-ethylhexyl acrylate, chlorohexyl acrylate, styrene, 2-chlorostyrene, 2,4-dichlorostyrene, acrylic acid, acrylamide, acrylonitrile, t-butyl acrylate, methyl acrylate, butyl acrylate, 2-(N-butylcarbamyl)ethyl methacrylate and 2-(N-ethylcarbamyl)ethyl methacrylate. Other diluting monomers that can be incorporated into the composition of the invention include 1,4-butylene dimethylacrylate or acrylate, ethylene dimethacrylate, hexanediol diacrylate or methacrylate, glyceryl diacrylate or methacrylate, glyceryl triacrylate or trimethylacrylate, pentaerythritol triacylate or trimethacrylate, pentaerythritol tetraacrylate or tetramethacrylate, diallyl phthalate, dipentaerythritol pentaacrylate, neopentylglycol triacrylate, 1,3,5-tri(2-methacryoyloxyethyl)-s-triazine, and polyacryloylhydantoins such as those describe in U.S. Pat. Nos. 3,808,226 and 3,852,302 and in assignee's copending patent application, Ser. No. 51,876, filed June 25, 1979.

The compositions of the invention can also include a variety of addenda utilized for their known purpose, such as stabilizers, inhibitors, lubricants, flexibilizers, pigments, dyes, reinforcing fillers such as finely divided silica, non-reinforcing fillers such as diatomaceous earth, metal oxides, asbestos, fiberglass, glass bubbles, talc, etc. Thermal polymerization inhibitors are useful and may be present in amounts less than 200 ppm by weight of the reacting materials. Fillers can generally be used in proportions up to about 200 percent by weight of the curable composition but preferably are used up to about 50 percent by weight. Where the polymerizing energy is radiation, it is desirable that the addenda be transparent to the radiation.

The compositions of the invention are prepared by simply mixing (under "safe light" conditions if the composition is to be sensitized to visible light) the polymerization catalyst and sensitizer (where used), the heterocyclic group-containing polyesters of the invention and, where used, the diluting monomers, binders and other addenda. Inert solvents may be employed if desired when effecting this mixture. Examples of suitable solvents are methanol, ethanol, acetone, acetonitrile and include any solvent which does not react with the components of the mixture.

The compositions of the invention can be used as adhesives, caulking and sealing compositions, casting and molding compositions, potting and encapsulating compositions, impregnating and coating compositions, binders, etc., depending on the particular combination of components. Where the polymerization catalyst is a photoinitiator, the composition can be used for in situ curing processes because of this insensitivity to oxygen.

The photopolymerizable compositions are particularly suitable for applications in the field of protective coatings and graphic arts because of their superior abrasion-resistance and adhesion to many rigid, resilient and flexible substrates such as metals, plastics, rubber, glass, paper, wood, and ceramics; their excellent resistance to most solvents and chemicals; and their capability for forming high resolution images. Among such uses are water or water/alcohol developable resists for chemical milling, gravure images, offset plates, stencil making, screenless lithography, relief printing plates, printed circuits, radiation cured protective coatings for glass, metal surfaces and the like. Also, because the polyesters of the invention are form-stable, they do not flow at temperatures below about 30° C., and many are non-tacky at these temperatures.

The photopolymerization of the compositions of the invention occurs on exposure of the compositions to any source of radiation emitting actinic radiation at a wavelength within the ultraviolet and visible spectral regions. Suitable sources of radiation include mercury, xenon, carbon arc and tungsten filament lamps, sunlight, etc. Exposures may be from less than about 1 second to 10 minutes or more depending upon the amounts of particular polymerizable materials, the photopolymerization catalyst being utilized and depending upon the radiation source and distance from the source and the thickness of the coating to be cured. The compositions may also be polymerized by exposure to electron beam irradiation. Generally speaking, the dosage necessary is from less than 1 megarad to 100 megarad or more. One of the major advantages with using electron beam curing is that highly pigmented compositions can be effectively cured at a faster rate than by mere exposure to actinic radiation.

The instant invention will be better understood by referring to the following specific but nonlimiting examples. It is understood that the examples are merely illustrative and that modifications can be made without departing from the spirit and scope of the invention.

EXAMPLE 1

Preparation of the polyester of 1,3-diglycidyl-5,5-dimethyl-hydantoin (DGDMH) and itaconic acid There were dissolved 110.4 g of DGDMH (0.8 mole epoxide equivalency), 52.0 g itaconic acid (0.8 m acid equivalency), 0.05 g 4-methoxyphenol, 0.76 g triethylamine, and 40 ml p-dioxane in a 250 ml three-necked round bottom flask equipped with mechanical stirrer, reflux condenser and $CaSO_4$ drying tube. The reaction flask temperature was maintained at 100° C. for 19.25 hours. At this time, chemical titration analysis showed that 99% of the epoxide and carboxylic acid groups had been consumed. The solvent can be removed at reduced pressure to yield a hard, glassy polyester which is soluble in tetrahydrofuran, p-dioxane, cyclohexanone and alcohol/water solutions.

The polyester and 2% by weight of 2,2-dimethoxy-2-phenyl acetophenone were coated from tetrahydrofuran onto 12 μm polyester film and dried to provide a 2.5 μm layer. A stencil was placed on the nontacky layer and the sample was exposed to a Hanovia 3D690 mercury arc lamp (140 watt) for 30 seconds. The sample was 6 cm from the irradiation source. The template was removed and the unexposed areas were washed away with a 10% aqueous ethanol developer to leave an image having excellent resolution.

Polyesters having the various other ring structures noted in Formula I above, wherein W is as defined above, can be made by substantially the same synthetic procedure as used in this example.

Assignee's copending patent applications, Ser. No. 51,876 (Wendling) and Ser. No. 51,877 (Wendling and Covington), filed June 25, 1979, are indicative of the known similarity of certain identifiable groups in giving similar reactions in the formation of derivative polymerizable groups.

EXAMPLE 2

Polyester of DGDMH and 1:1 itaconic acid-$C_{36}$ dimer acid 29.4 g DGDMH (0.2 m epoxide equivalency), 28.5 g $C_{36}$ dimer acid (0.1 m acid equivalency), 6.5 g itaconic acid (0.1 m acid equivalency), 0.05 g 4-methoxy phenol, 0.36 g dimethyl benzylamine, and 30 ml p-dioxane were dissolved in a 250 ml three-necked round bottom flask equipped with mechanical stirrer, reflux condenser, and $CaSO_4$ drying tube. The reaction flask was heated to 90° C. for 36.0 hours. At this time chemical titration analysis showed that greater than 95% of the epoxide and carboxylic acid groups had been consumed.

A coating of the polymer was prepared and exposed for 60 seconds as described in Example 1. On development with 50% aqueous ethanol, an image of cured polymer having excellent resolution was obtained.

EXAMPLE 3

Polyester of DGDMH and 7.6:1 itaconic acid-trimesic acid.

There were dissolved 18.6 g DGDMH (0.2 m equivalents epoxide), 11.3 g itaconic acid (0.175 m equivalents acid), 2.62 g trimesic acid (0.035 m equivalents acid), 0.05 g 4-methoxyphenol and 0.36 g triethyl amine in 20 ml p-dioxane in a 250 ml three-necked flask equipped with mechanical stirrer, reflux condenser, and $CaSO_4$ drying tube. The reaction flask was heated to 90° C. for 23.0 hours. At this time chemical titration of the epoxide groups showed the reaction to be 98.2% complete. The solvent was removed at reduced pressure to give a hard glassy polymer soluble in tetrahydrofuran and aqueous alcohol.

A coating of the polymer and 2% by weight of 2,2-dimethoxy-2-phenyl acetophenone was exposed for 60 seconds as described for the polyester of Example 1. On development with aqueous alcohol, an image of cured polymer having resolution was obtained.

EXAMPLE 4

Polyester of 1:09 DGDMH and itaconic acid endcapped with acrylic acid

There were charged 43.84 g DGDMH (0.32 m epoxide equivalents), 17.93 g (0.29 m carboxylic acid equivalents), itaconic acid, 0.76 g 4-methoxy phenol, and 0.58 g triethylamine into a 250 ml three-necked round bottom flask equipped with a mechanical stirrer, reflux condense and CaSO$_4$ drying tube. The reaction flask temperature was raised to 95° C. After 6.0 hours 2.21 g (0.03 m carboxylic acid equivalents) acrylic acid were added. After 17.75 total hours, chemical titration analysis showed that 99% of the epoxide groups had been consumed. The solvent was sparged off with dry air leaving a glassy polyester soluble in tetrahydrofuran and alcohol/water solution.

A layer of this material was prepared and exposed for 30 seconds as described in Example 1. On development with aqueous alcohol, an image of cured polymer having excellent resolution was obtained.

EXAMPLE 5

Polyester of 1:0.9 DGDMH and maleic acid encapped with acrylic acid

A polymer was prepared similarly to that of Example 4 using 28.6 g of DGDMH (0.2 g epoxide equivalency), 19.28 g maleic acid (0.18 m carboxylic acid equivalency), and 1.44 g acrylic acid (0.02 m acid equivalency).

A layer of this material was prepared and exposed for 45 seconds as described in Example 1. On development with aqueous alcohol, an image of cured polymer having excellent resolution was obtained.

EXAMPLE 6

Polyester of DGDMH and itaconic acid having 50% of the secondary hydroxyl groups reacted with 2-methacryloyloxyethyl isocyanate (MEI)

There were dissolved 19.28 g of the copolymer of Example 1 in 40 ml cyclohexanone in a 250 ml three-necked round bottom flask equipped with a pressure equalizing dropping funnel, reflux condenser, mechanical stirrer and CaSO$_4$ drying tube. The reaction flask was heated to 55° C. and 7.78 g (0.5 m equivalent isocyanate), 2-(methacryloyloxy)ethyl isocyanate was added dropwise over the course of ten minutes. The reaction was stirred for 3 hours at 55° C., cooled to room temperature and the polymer was precipitated from diethyl ether.

The polymer was coated and exposed for 15 seconds to a Hanovia 3D690 lamp as described in Example 1. Development was effected with aqueous ethanol. An image having excellent resolution was obtained.

EXAMPLE 7

Polyester of DGDMH and itaconic acid having 75% of the secondary hydroxyl groups reacted with phenyl isocyanate This polymer was prepared in a manner similar to that of the polymer described in Example 6, except substituting phenyl isocyanate for 2-(methacryloyloxy)ethyl isocyanate.

A solution of the polyester obtained was coated, dried and imaged in a manner similar to that of Example 1.

This polymer can be imaged by a 90 second exposure to a 100 watt Hanovia 3D690 mercury arc lamp followed by developing with aqueous ethanol.

EXAMPLE 8

Polyester of DGDMH and itaconic acid having 5% of the secondary hydroxyl groups esterified with maleic anhydride Hydantoin-itaconic acid polyester (18.5 g) prepared as described in Example 1 was dissolved in 40 ml paradioxane in a 250 ml three-necked round bottom flask equipped with mechanical stirrer, reflux condenser and CaSO$_4$ drying tube. There was added 0.50 g maleic anhydride and the solution was heated at 95° C. for two hours. The reaction was returned to room temperature and the solvent was removed under vacuum.

The resulting polymer is soluble in water, water/alcohol solutions and tetrahydrofuran (THF). Films of this material were prepared as described in Example 1. Imaging was performed by exposure to a 100 watt Hanovia 3D690 mercury arc lamp for 60 seconds followed by development with water.

EXAMPLE 9

Polyester of DGDMH and itaconic acid having 30% of the secondary hydroxyls reacted with MEI and 10% esterified with maleic anhydride Polyester prepared as described in Example 1 was reacted with 2-(methacryloyloxy)ethyl isocyanate as described in Example 6 to give a polyester having 30% instead of 50% of the secondary hydroxyls reacted. Into 50 ml paradioxane was dissolved 18.5 g of this polymer in a 500 ml three-necked round bottom flask equipped with mechanical stirrer, reflux condenser and CaSO$_4$ drying tube. There was added 0.98 g maleic acid and the mixture was heated at 90° for three hours. After this time the reaction was allowed to cool to room temperature and the polymer was precipitated from diethyl ether. This polymer is soluble in water, alcohol/water, and THF.

Coating and imaging can be performed as described for the polymer of Example 1. Curing is effected in 60 seconds with a 100 watt Hanovia 3D690 mercury arc lamp.

EXAMPLE 10

Photocuring hydantoin-containing polyesters with acrylate coreactants

A 2.5 μm film containing 68% of the polymer from Example 6 and 30% of the hydantoin hexaacrylate (described in assignee's copending patent application, Ser. No. 51,876, filed June 25, 1979) and 2% by weight of 2,2-dimethoxy-2-phenyl acetophenone was cast onto 12 μm polyester from tetrahydrofuran. After solvent evaporation, the film was cured to an abrasion resistant surface in 15 seconds upon exposure to the Hanovia processing lamp described in Example 1. This film can also be imaged and developed as described in Example 1.

What is claimed is:

1. A composition comprising an energy-curable polyester, said polyester being crosslinkable and having heterocyclic moieties and backbone alpha-methylene groups and repeating units of the general formula:

$$-O-CH_2-\underset{R^2}{\underset{|}{C}}-R-N\underset{\underset{O}{\parallel}}{\overset{W-C\overset{O}{\nearrow}}{\diagdown}}N-R-\underset{R^2}{\underset{|}{C}}-CH_2-O-\overset{O}{\overset{\parallel}{C}}-Q-\overset{O}{\overset{\parallel}{C}}-(Z)_a$$

wherein
R is a single bond or an alkylene group having 1 to 6 carbon atoms and optionally one catenary oxygen;
$R^1$ is hydrogen,

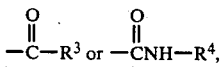

wherein $R^3$ is alkenyl or alkyl having 2 to 5 carbon atoms and can be substituted by phenyl or carboxyl and $R^4$ is aliphatic or aromatic hydrocarbyl having up to 8 carbon atoms;

$R^2$ is hydrogen or methyl;

W is a divalent group that is required to complete a 5- or 6-membered heterocyclic ring, wherein W is

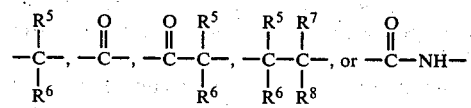

and wherein $R^5$, $R^6$, $R^7$, and $R^8$ are independently hydrogen or lower alkyl or 1 to 4 carbon atoms;

Q is the divalent or trivalent residue of hydrocarbyl di- or tri-carboxylic acids, said residue formed by the removal of active hydrogens from the carboxylic acid groups and containing up to 40 carbon atoms and optionally containing catenary oxygen atoms; and a is zero or one, but can be one for no more than 20 mole percent of the carboxylic acids, and

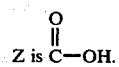

Z is $\overset{O}{\overset{\|}{C}}$—OH.

2. A composition according to claim 1 wherein said polyester further comprises terminal groups selected from the class containing epoxy groups, carboxylic groups, acryloyl groups, and methacryloyl groups.

3. The composition according to claim 1 wherein $R^3$ is alkenyl.

4. The composition according to claim 1 wherein $R^4$ is acryoyloxyalkyl or methacryloyloxyalkyl, in which the alkyl group contains 2 to 4 carbon atoms.

5. The composition according to claim 1 wherein W is

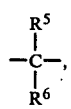

and $R^5$ and $R^6$ are as defined above.

6. The composition according to claim 1 wherein Q is the residue of hydrocarbyl di- or tri-carboxylic acids containing 4 to 12 carbon atoms.

7. The composition according to claim 2 wherein said polyester has a number average molecular weight between about 3,000 and about 30,000.

8. The composition according to claim 2 wherein Q contains at least 10 mole percent alpha-methylene groups.

9. The composition according to claim 2 wherein Q contains at least 20 mole percent alpha-methylene groups.

10. The composition according to claim 2 wherein Q contains at least 30 mole percent alpha-methylene groups.

11. The method of preparing an energy-curable polyester, said polyester being crosslinkable and having heterocyclic moieties and backbone alpha-methylene groups and having repeating units of the general formula:

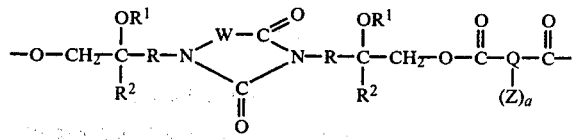

wherein

R is a single bond or an alkylene group having 1 to 6 carbon atoms and optionally one catenary oxygen;

$R^1$ is hydrogen,

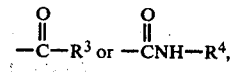

wherein $R^3$ is alkenyl or alkyl having 2 to 5 carbon atoms and can be substituted by phenyl or carboxyl and $R^4$ is aliphatic or aromatic hydrocarbyl having up to 8 carbon atoms;

$R^2$ is hydrogen or methyl;

W is a divalent group that is required to complete a 5- or 6-membered heterocyclic ring, wherein W is

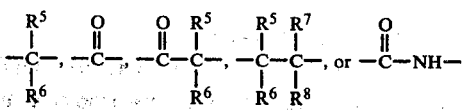

and wherein $R^5$, $R^6$, $R^7$, and $R^8$ are independently hydrogen or lower alkyl of 1 to 4 carbon atoms;

Q is the divalent or trivalent residue of hydrocarbyl di- or tri-carboxylic acids, said residue formed by the removal of active hydrogens from the carboxylic acid groups and containing up to 40 carbon atoms and optionally containing catenary oxygen atoms; and a is zero or one, but can be one for no more than 20 mole percent of the dicarboxylic acids, and

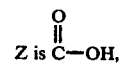

Z is $\overset{O}{\overset{\|}{C}}$—OH, which method includes the steps of (a) admixing together (1) 1.0 mole equivalent of a bis-(epoxy)heterocyclic compound having the formula:

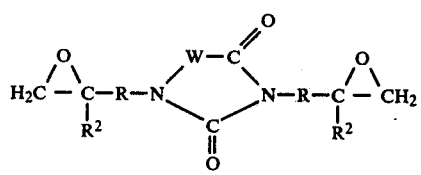

wherein R, $R^2$ and W are as defined above;

(2) 0.8 to 1.2 mole equivalents of a polycarboxylic acid having the formula:

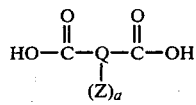

wherein Q and a are as defined above;

(3) a catalytically active amount of a base polymerization catalyst (4) less than 200 ppm by weight of a thermal polymerization inhibitor, (b) reacting components (1) and (2).

12. The method according to claim 11 wherein $R^3$ is alkenyl.

13. The method according to claim 11 wherein $R^4$ is acryloyloxyalkyl or methacryloyloxyalkyl, in which the alkyl group contains 2 to 4 carbon atoms.

14. The method according to claim 11 wherein W is

and $R^5$ and $R^6$ are as defined above.

15. The method according to claim 11 wherein Q is the residue of hydrocarbyl di- or tri-carboxylic acids containing 4 to 12 carbon atoms.

16. The method according to claim 11 wherein Q contains at least 10 mole percent alpha-methylene groups.

17. The method according to claim 11 wherein Q contains at least 20 mole percent alpha-methylene groups.

18. The method according to claim 11 wherein Q contains at least 30 mole percent alpha-methylene groups.

19. The method according to claim 11 wherein the bis-(epoxy)heterocyclic compound is a 1,3-diglycidylhydantoin.

20. The method according to claim 11 wherein the bis-(epoxy)heterocyclic compound is 1,3-diglycidyl-5,5-dimethylhydantoin.

21. The method according to claim 11 wherein the polycarboxylic acid is an alpha-methylenedicarboxylic acid.

22. The method according to claim 21 wherein the polycarboxylic acid is itaconic acid.

23. The method according to claim 11 wherein $R^1$ is derived from acryloyloxyalkyl isocyanates, wherein the alkyl group has 2 to 4 carbon atoms.

24. The method according to claim 11 wherein $R^1$ is derived from maleic anhydride or succinic anhydride.

25. The method according to claim 11 further comprising an inert solvent.

26. The method according to claim 11 further comprising admixing (1), (2), (3) and (4) with ethylenically unsaturated monomers.

27. The energy-cured crosslinked polymer comprising the free radical initiation reaction product of the polyesters of claim 1.

* * * * *

UNITED STATES PATENT AND TRADEMARK OFFICE
CERTIFICATE OF CORRECTION

PATENT NO. : 4,309,529
DATED : January 5, 1982
INVENTOR(S) : Larry A. Wendling

It is certified that error appears in the above—identified patent and that said Letters Patent is hereby corrected as shown below:

Column 6, line 6, "methylhydantoin, 1,3diglycidyl-5hexyl-5-methyldan-" should read -- methylhydantoin, 1,3-diglycidyl-5-hexyl-5-methyldan- --.

Column 10, line 59, "polymer having resolution was obtained." should read -- polymer having excellent resolution was obtained. --.

Signed and Sealed this

First Day of June 1982

[SEAL]

Attest:

GERALD J. MOSSINGHOFF

*Attesting Officer*   *Commissioner of Patents and Trademarks*